United States Patent
Sakai et al.

(10) Patent No.: US 10,070,523 B2
(45) Date of Patent: Sep. 4, 2018

(54) PRINTED WIRING BOARD WITH CONDUCTOR POST HAVING MULTIPLE SURFACE ROUGHNESS AND METHOD FOR MANUFACTURING THE SAME

(71) Applicant: IBIDEN CO., LTD., Ogaki-shi (JP)

(72) Inventors: Shunsuke Sakai, Ogaki (JP); Toshiki Furutani, Ogaki (JP); Kosuke Ikeda, Ogaki (JP); Takema Adachi, Ogaki (JP); Takayuki Katsuno, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 15/084,992

(22) Filed: Mar. 30, 2016

(65) Prior Publication Data

US 2016/0316558 A1 Oct. 27, 2016

(30) Foreign Application Priority Data

Apr. 24, 2015 (JP) ................. 2015-089546

(51) Int. Cl.
| | |
|---|---|
| *H05K 1/11* | (2006.01) |
| *H05K 3/40* | (2006.01) |
| *H01L 21/48* | (2006.01) |
| *H01L 23/498* | (2006.01) |
| *H01L 23/14* | (2006.01) |

(Continued)

(52) U.S. Cl.
CPC ............ *H05K 1/11* (2013.01); *H01L 21/486* (2013.01); *H01L 23/12* (2013.01); *H01L 23/145* (2013.01); *H01L 23/49861* (2013.01); *H05K 3/4007* (2013.01); *H05K 3/205* (2013.01); *H05K 3/382* (2013.01); *H05K 2201/0367* (2013.01); *H05K 2203/0307* (2013.01)

(58) Field of Classification Search
None
See application file for complete search history.

(56) References Cited

U.S. PATENT DOCUMENTS

| | | | | |
|---|---|---|---|---|
| 4,151,543 A | * | 4/1979 | Hayakawa | ............ H01L 23/145 257/668 |
| 4,354,895 A | * | 10/1982 | Ellis | ....................... H05K 3/205 156/150 |

(Continued)

FOREIGN PATENT DOCUMENTS

JP 2011-238964 A 11/2011

*Primary Examiner* — Dimary Lopez Cruz
*Assistant Examiner* — Muhammed Azam
(74) *Attorney, Agent, or Firm* — Oblon, McClelland, Maier & Neustadt, L.L.P.

(57) ABSTRACT

A printed wiring board includes a resin insulating layer, a wiring conductor layer embedded in the insulating layer such that the wiring layer has first surface exposed from the insulating layer, and a conductor post formed in the insulating layer and on second surface of the wiring layer on the opposite side with respect to the first surface of the wiring layer such that the conductor post has side surface covered by the insulating layer and end surface exposed from the insulating layer on the opposite side with respect to the wiring layer. The conductor post is formed such that the side surface of the conductor post is a roughened side surface having surface roughness of first roughness R1, the end surface of the conductor post is a roughened end surface having surface roughness of second roughness R2, and the first and second roughnesses R1, R2 satisfy R1>R2.

20 Claims, 7 Drawing Sheets

(51) Int. Cl.
*H01L 23/12* (2006.01)
*H05K 3/36* (2006.01)
*H05K 3/20* (2006.01)
*H05K 3/38* (2006.01)

(56) References Cited

U.S. PATENT DOCUMENTS

| | | | | |
|---|---|---|---|---|
| 4,970,107 A * | 11/1990 | Akahoshi | | H05K 3/384 156/60 |
| 5,021,296 A * | 6/1991 | Suzuki | | H05K 3/384 361/748 |
| 6,294,744 B1 * | 9/2001 | Kinoshita | | H05K 3/381 174/255 |
| 6,376,049 B1 * | 4/2002 | Asai | | H05K 3/0094 174/250 |
| 6,596,384 B1 * | 7/2003 | Day | | H05K 1/0242 174/250 |
| 6,710,260 B1 * | 3/2004 | Seki | | H05K 3/381 174/255 |
| 6,835,895 B1 * | 12/2004 | Asai | | H05K 1/0269 174/255 |
| 7,332,816 B2 * | 2/2008 | Hirose | | H05K 1/0256 174/261 |
| 8,052,882 B2 * | 11/2011 | Kondo | | H05K 3/108 216/105 |
| 9,698,094 B2 * | 7/2017 | Yanagisawa | | H01L 23/49838 |
| 9,716,059 B2 * | 7/2017 | Inagaki | | H01L 23/49822 |
| 2004/0191491 A1 * | 9/2004 | Sugaya | | H05K 3/20 428/209 |
| 2008/0128288 A1 * | 6/2008 | Hashimoto | | H05K 3/205 205/125 |
| 2008/0245549 A1 * | 10/2008 | Kodani | | H05K 3/205 174/126.1 |
| 2008/0280032 A1 * | 11/2008 | Chen | | H05K 3/205 427/97.3 |
| 2009/0196010 A1 * | 8/2009 | Nakasato | | H01L 21/4846 361/820 |
| 2009/0288870 A1 * | 11/2009 | Kondo | | H01L 21/4846 174/261 |
| 2010/0141000 A1 * | 6/2010 | Chadwick | | A47C 1/03255 297/284.4 |
| 2011/0253306 A1 * | 10/2011 | Asai | | H05K 3/387 156/272.8 |
| 2012/0153463 A1 * | 6/2012 | Maeda | | H05K 1/115 257/737 |
| 2012/0168212 A1 * | 7/2012 | Ha | | H05K 3/383 174/257 |
| 2013/0180772 A1 * | 7/2013 | Inoue | | H05K 1/111 174/263 |
| 2013/0256854 A1 * | 10/2013 | Kobayashi | | H01L 23/49568 257/675 |
| 2014/0097525 A1 * | 4/2014 | Kim | | H01L 23/145 257/668 |
| 2014/0175663 A1 * | 6/2014 | Chen | | H01L 24/96 257/774 |
| 2014/0196939 A1 * | 7/2014 | Nishida | | H05K 3/28 174/261 |
| 2014/0202746 A1 * | 7/2014 | Anderson | | H01L 21/76847 174/255 |
| 2015/0001738 A1 * | 1/2015 | Shimizu | | H05K 1/115 257/778 |
| 2015/0009645 A1 * | 1/2015 | Kaneko | | H05K 1/181 361/767 |
| 2015/0014020 A1 * | 1/2015 | Kaneko | | H05K 3/4007 174/250 |
| 2015/0034366 A1 * | 2/2015 | Yoshioka | | H05K 1/111 174/251 |
| 2015/0223332 A1 * | 8/2015 | Nishida | | H01L 21/563 174/261 |
| 2015/0250054 A1 * | 9/2015 | Yoshikawa | | H05K 3/4007 361/767 |
| 2016/0043024 A1 * | 2/2016 | Furutani | | H01L 23/49827 361/783 |
| 2016/0343654 A1 * | 11/2016 | Kojima | | H01L 29/34 |

* cited by examiner

PRINTED WIRING BOARD WITH CONDUCTOR POST HAVING MULTIPLE SURFACE ROUGHNESS AND METHOD FOR MANUFACTURING THE SAME

CROSS-REFERENCE TO RELATED APPLICATIONS

The present application is based upon and claims the benefit of priority to Japanese Patent Application No. 2015-089546, filed Apr. 24, 2015, the entire contents of which are incorporated herein by reference.

BACKGROUND OF THE INVENTION

Field of the Invention

The present invention relates to a printed wiring board and a method for manufacturing the printed wiring board.

Description of Background Art

In Japanese Patent Laid-Open Publication No. 2011-238964, a patterned first conductor layer is formed on a carrier. A second conductive layer is formed on the pattern. The first conductor layer and the second conductive layer are covered by a mold resin except the surfaces on the opposite sides of their connecting parts. A semiconductor chip is mounted on an exposed surface of the first conductor layer. Another printed wiring board or a motherboard or the like is connected to an exposed surface of the second conductive layer. The entire contents of this publication are incorporated herein by reference.

SUMMARY OF THE INVENTION

According to one aspect of the present invention, a printed wiring board includes a resin insulating layer, a wiring conductor layer embedded in the resin insulating layer such that the wiring conductor layer has a first surface exposed from the resin insulating layer, and a conductor post formed in the resin insulating layer and on a second surface of the wiring conductor layer on the opposite side with respect to the first surface of the wiring conductor layer such that the conductor post has a side surface covered by the resin insulating layer and an end surface exposed from the resin insulating layer on the opposite side with respect to the wiring conductor layer. The conductor post is formed such that the side surface of the conductor post is a roughened side surface having a surface roughness of a first roughness R1, the end surface of the conductor post is a roughened end surface having a surface roughness of a second roughness R2, and the first roughness R1 and the second roughness R2 satisfy R1>R2.

According to another aspect of the present invention, a method for manufacturing a printed wiring board includes forming a wiring conductor layer on a base metal foil such that the wiring conductor layer has a pattern, forming a conductor post on the wiring conductor layer, applying a roughening treatment to at least a side surface of the conductor post such that the side surface of the conductor post has a surface roughness of a first roughness R1, forming a resin insulating layer such that the resin insulating layer covers at least the side surface of the conductor post and an end surface of the conductor post on the opposite side with respect to the wiring conductor layer, polishing the resin insulating layer such that the end surface of the conductor post is exposed from the resin insulating layer and has a surface roughness which is smaller than the surface roughness of the first roughness R1, and applying an etching solution to the wiring conductor layer and the conductor post such that the base metal foil is removed from the wiring conductor layer to expose a first surface of the wiring conductor layer and that the end surface of the conductor post has a surface roughness of a second roughness R2 which satisfies R1>R2.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

Figure 1A:
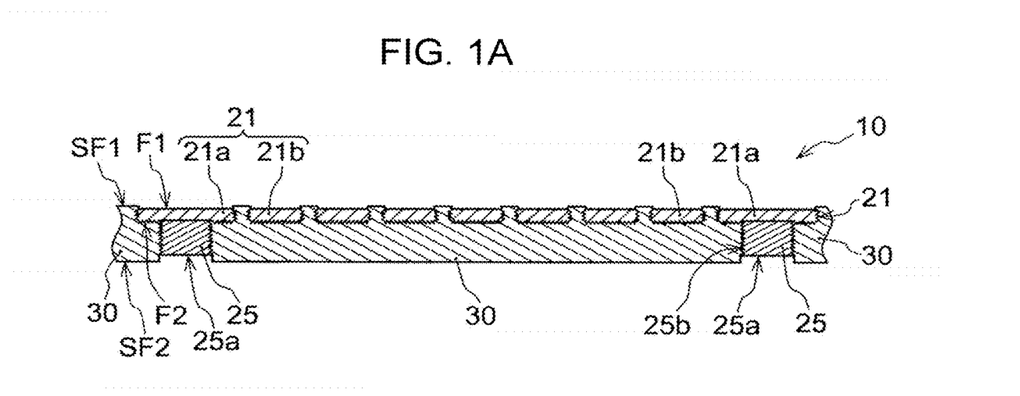
FIG. 1A is a cross-sectional view describing a printed wiring board according to an embodiment of the present invention.
Figure 1B:
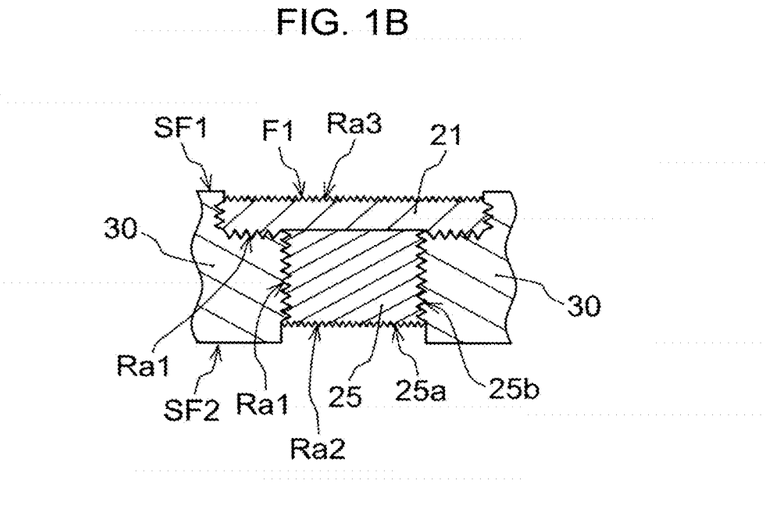
FIG. 1B is an enlarged view of a conductor post portion of FIG. 1A.

As illustrated in FIGS. 1A and 1B, a printed wiring board 10 of an embodiment of the present invention includes: a wiring conductor layer 21 that has a first surface (F1) and a second surface (F2) that is on an opposite side of the first surface (F1); a conductor post 25 that is formed on the second surface (F2) of the wiring conductor layer 21; and a resin insulating layer 30 that has a first surface (SF1) and a second surface (SF2) that is on an opposite side of the first surface (SF1), embeds the wiring conductor layer 21 such that the first surface (F1) of the wiring conductor layer 21 is exposed on the first surface (SF1) side, and covers a side surface (25b) of the conductor post 25 and exposes an end surface (25a) of the conductor post 25 on the second surface (SF2) side. In the embodiment, the side surface (25b) and the end surface (25a) of the conductor post 25 are subjected to a roughening treatment. When surface roughness of the side surface (25b) is first roughness (R1) and surface roughness of the end surface (25a) is second roughness (R2), the conductor post 25 is formed such that R1>R2.

Methods for obtaining surface roughness include arithmetic average roughness (Ra), maximum height (Ry), and ten-point average roughness (Rz). Any one of the methods may be used. However, comparison between roughnesses is performed for roughnesses that are obtained using the same method. In the present specification, surface roughnesses measured using any one of the methods are collectively indicated using "R". The arithmetic average roughness (Ra) refers to a numerical value in units of pm obtained by extracting from a roughness curve a portion in a range of a reference length in a direction of an average line of the roughness curve and dividing a sum of absolute values of areas between the roughness curve and the average line by the reference length. Further, the maximum height (Ry) refers to a numerical value in units of pm obtained by extracting from a roughness curve a portion in a range of a reference length in a direction of an average line of the roughness curve and obtaining a distance between a peak line and a valley line (a difference between a maximum height and a minimum height) of the extracted portion. Further, the ten-point average roughness (Rz) refers to a numerical value in units of μm obtained by extracting from a roughness curve a portion in a range of a reference length in a direction of an average line of the roughness curve, and obtaining a sum of an average value of heights of five highest peaks and an average value of absolute values of depths of five deepest valleys, the heights and the depths being measured in a vertical magnification direction from the average line of the extracted portion.

In the embodiment, as illustrated in an enlarged view of FIG. 1B in which roughness is exaggerated, arithmetic average roughnesses (Ra1, Ra2) are respectively formed in the side surface (25b) of the conductor post 25 and the end surface (25a) of the conductor post 25. The first surface (F1) of the wiring conductor layer 21 is also subjected to a roughening treatment. An arithmetic average surface roughness (Ra3) of the first surface (F1) is substantially the same as, but can also be slightly different from, the surface roughness (Ra2) of the end surface (25a) of the conductor post 25. As will be clear from a manufacturing method to be described later, the end surface (25a) of the conductor post 25 has the same surface roughness as the surface roughness (Ra1) of the side surface (25b) of the conductor post 25 due to a roughening treatment for the side surface (25b). However, thereafter, as described above, the end surface (25a) is polished by buffing, CMP or the like and thus is flattened. Thereafter, the end surface (25a) is again subjected to a roughening treatment and thus the surface roughness of the end surface (25a) is changed.

Figure 4A:
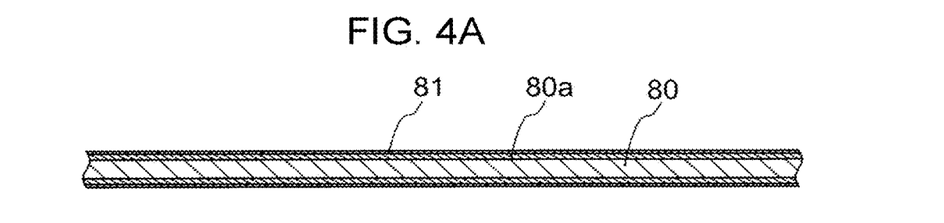
FIG. 4A is an explanatory diagram of a method for manufacturing the printed wiring board illustrated in FIG. 1A according to an embodiment of the present invention.
Figure 4B:
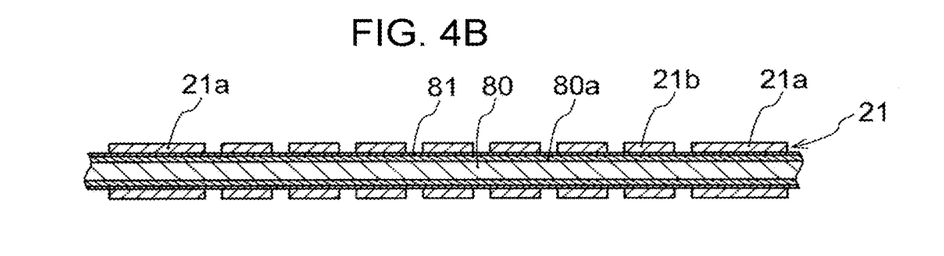
FIG. 4B is an explanatory diagram of a method for manufacturing the printed wiring board illustrated in FIG. 1A according to an embodiment of the present invention.
Figure 4C:
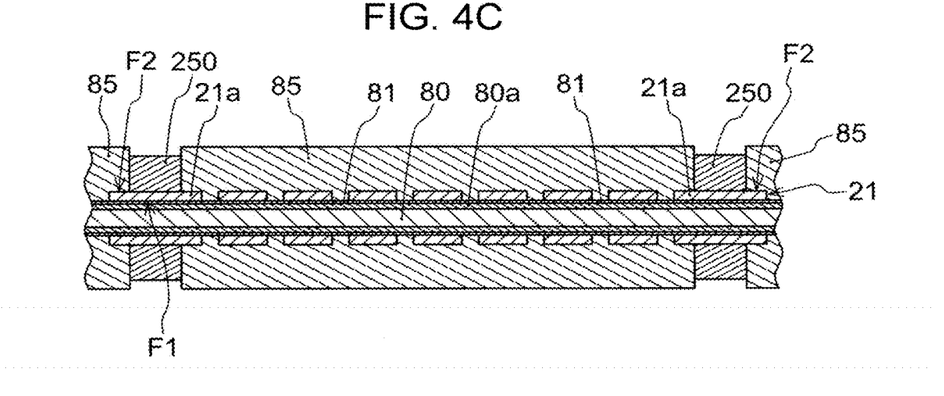
FIG. 4C is an explanatory diagram of a method for manufacturing the printed wiring board illustrated in FIG. 1A according to an embodiment of the present invention.
Figure 4D:
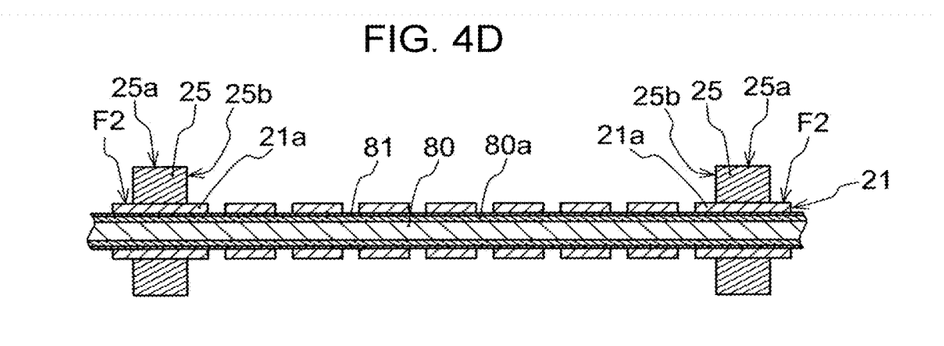
FIG. 4D is an explanatory diagram of a method for manufacturing the printed wiring board illustrated in FIG. 1A according to an embodiment of the present invention.
Figure 4E:
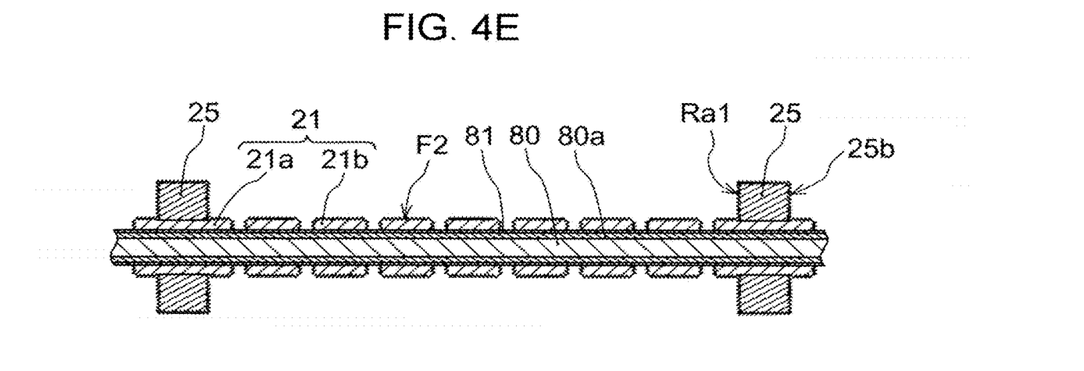
FIG. 4E is an explanatory diagram of a method for manufacturing the printed wiring board illustrated in FIG. 1A according to an embodiment of the present invention.

The roughening treatment of the side surface (25b) of the conductor post 25 is performed in a process before the resin insulating layer 30 is formed after the conductor post 25 is formed (see FIG. 4E). Examples of the roughening treatment include a CZ treatment and the like. In the CZ treatment, by being immersed in a chemical solution made of a mixture of formic acid and hydrochloric acid, the surface of the conductor post (copper) can be jagged. The roughening treatment is applied to not only the side surface (25b) of the conductor post 25, but the entire exposed metal surface. Therefore, not only the side surface (25b) of the conductor post 25, but also the end surface (25a), a portion of the second surface (F2) of the wiring conductor layer 21 where the conductor post 25 is not formed, and a side surface of the wiring conductor layer 21 are subjected to the roughening treatment. However, as described above, since the end surface (25a) of the conductor post 25 is polished, the surface roughness due to the roughening treatment is temporarily nearly flattened. The arithmetic average roughness (Ra1) due to the roughening treatment is 0.4 μm or more and 1.5 μm or less, and preferably 0.5 μm or more and 0.9 μm or less. When the surface roughness is greater than this, mechanical strength is reduced. Further, the process of the roughening treatment requires a long time, which is not practical. On the other hand, when the surface roughness is smaller than this, peeling due to a difference in thermal expansion coefficient cannot be suppressed. As another method for the roughening treatment, a blackening (oxidation)-reduction treatment can be adopted. As yet another method, sandblasting can be adopted. In the case of sandblasting, a desired surface roughness can be obtained by adjusting a particle diameter of sand particles.

The roughening treatment of the end surface (25a) of the conductor post 25 and the first surface (F1) of the wiring conductor layer 21 is performed in an etching process. That is, as will be described in the manufacturing method (to be described later), the wiring conductor layer 21 is formed on a base metal foil 81 (see FIG. 4B), and in the end the base metal foil 81 is removed by etching. During the etching, the end surface (25a) of the conductor post 25 is also exposed to an etching solution. Therefore, the end surface (25a) of the conductor post 25 is also etched. During the etching, a hydrogen peroxide based etching solution is used, and a roughening treatment that roughens the surface is performed. The arithmetic average roughness (Ra2) of the surface is adjusted to 0.1 μm or more and 0.6 μm or less, and more preferably 0.2 μm or more and 0.5 μm or less.

When the base metal foil 81 is removed, when the base metal foil 81 is not completely removed, short circuiting may occur between patterns of the wiring conductor layer 21. Therefore, the base metal foil 81 is completely removed by etching. As a result, the surface of the wiring conductor layer 21 is also slightly etched. The first surface (F1) of the wiring conductor layer 21 becomes lower than the first surface (SF1) of the resin insulating layer, and the exposed surface (first surface (F1)) of the wiring conductor layer 21 is also subjected to the roughening treatment and is roughened. An arithmetic average roughness (Ra3) of the surface is substantially equal to the surface roughness (Ra2) of the end surface (25a) of the conductor post 25.

As described above, the roughening treatment of the side surface (25b) of the conductor post 25 and the roughening treatment of the end surface (25a) of the conductor post 25 and the first surface (F1) of the wiring conductor layer 21 are performed as separate roughening treatments, and their surface roughnesses are formed such that Ra1>Ra2. As described above, the roughening treatment of the side surface (25b) of the conductor post 25 is intended to improve adhesion between the resin insulating layer 30 and the conductor post 25 and the like against heat cycles. On the other hand, the end surface (25a) of the conductor post 25 and the first surface of the wiring conductor layer 21 are connected via solder to a motherboard, an electronic component or the like. Therefore, the connection is between metals and thus peeling due to heat cycles is not as much a problem as it is in the case of the connection between the conductor post 25 and the resin insulating layer 30. Rather, when the surface roughness is too excessive, the connection to the motherboard or the like becomes unstable. This is because it is possible that, on a soldering surface, it becomes difficult for solder to enter into deep portions of an uneven surface so a contact area is reduced. Further, when the contact area is reduced, a problem related to electrical characteristics such as that a contact resistance increases can also occur. Therefore, a relatively small surface roughness allows solder to easily enter and also allows the contact area to be increased. Therefore, it is preferable that the arithmetic average roughness (Ra2) of the end surface (25a) of the conductor post 25 be smaller than the arithmetic average roughness (Ra1) of the side surface (25b). From this point of view, it is preferable for the arithmetic average roughness (Ra2) of the end surface (25a) of the conductor post 25 to have the above-described value.

The wiring conductor layer 21 is embedded in the resin insulating layer 30 on the first surface (SF1) side such that the first surface (F1) of the wiring conductor layer 21 is exposed on the first surface (SF1) side of the resin insulating layer 30. That is, the wiring conductor layer 21 and the resin insulating layer 30 are in contact with each other not only at the second surface (F2) of the wiring conductor layer 21, but also at side surfaces of the wiring conductor layer 21, specifically, at side surfaces of a first pattern (21a) and a second pattern (21b) that are formed in the wiring conductor layer 21. A portion of the second surface (F2) of the wiring conductor layer 21 where the conductor post 25 is not formed, and the side surfaces of the first pattern (21a) and the second pattern (21b) are also subjected to a roughening treatment. An arithmetic average roughness (Ra1) of the portion of the wiring conductor layer 21 where the conductor post 25 is not formed and the side surfaces of the first pattern (21a) and the second pattern (21b) is the same as arithmetic average roughness (Ra1) of the side surface (25b) of the conductor post 25. Therefore, even when the first pattern (21a) and the second pattern (21b) are formed at a fine pitch and an area of the second surface (F2) of the wiring conductor layer 21 is reduced, the adhesion between the wiring conductor layer 21 and the resin insulating layer 30 can be maintained. Further, by embedding the wiring conductor layer 21 in the resin insulating layer 30, the printed wiring board 10 can be formed thin.

As described above, the first pattern (21a) and the second pattern (21b) are formed in the wiring conductor layer 21. In the present embodiment, the first pattern (21a) is a wiring pattern that electrically connects to another printed wiring board (not illustrated in the drawings) or the like that is connected to the printed wiring board 10 on the second surface (SF2) side of the resin insulating layer 30. Here, the other printed wiring board may be a motherboard of an electronic device or the like in which the printed wiring board 10 is used, or may be a laminated body of an insulating layer and a conductor layer, the laminated body and the printed wiring board 10 forming a multilayer wiring board. Further, the second pattern (21b) may be, for example, a connection pad to which a semiconductor element (not illustrated in the drawings) or the like is connected. Further, a wiring pattern other than the first and second patterns (21a, 21b) may also be formed in the wiring conductor layer 21. For example, a wiring pattern (not illustrated in the drawings) that connects the second pattern (21b) and the first pattern (21a) may also be formed in the wiring conductor layer 21. In this case, among electrodes of a semiconductor element that is connected to the second pattern (21b), an electrode that is electrically connected to outside is electrically connected via the wiring pattern (not illustrated in the drawings) to the first pattern (21a) and the conductor post 25.

As illustrated in FIG. 1A, the conductor post 25 is formed on the second surface (F2) of the first pattern (21a) of the wiring conductor layer 21. The conductor post 25 extends from the second surface (F2) of the first pattern (21 a) toward the second surface (SF2) side of the resin insulating layer 30. The end surface (25a) of the conductor post 25 is exposed on the second surface (SF2) side of the resin insulating layer 30. For example, as described above, the conductor post 25 electrically connects a predetermined electrode of the semiconductor element (not illustrated in the drawings) and the above-described other printed wiring board or the like, the semiconductor element being connected to the second pattern (21b). Therefore, a number of conductor posts 25 corresponding to a number of the electrodes of the semiconductor element (not illustrated in the drawings) may be provided along an outer periphery of the second surface (SF2) of the resin insulating layer 30 or over the entire second surface (SF2).

The resin insulating layer 30 covers the side surface of the wiring conductor layer 21 and a portion of the second surface (F2) where the conductor post 25 is not formed, and also covers the side surface (25b) of the conductor post 25. The first surface (F1) of the wiring conductor layer 21 is exposed on the first surface (SF1) of the resin insulating layer 30, and the end surface (25a) of the conductor post 25 is exposed on the second surface (SF2) on an opposite side. A thickness of the resin insulating layer 30 is not particularly limited. However, from a point of view of having a certain degree of rigidity to allow easy handling while complying with a demand for reduction in thickness of the printed wiring board 10, it is preferable that the thickness of the resin insulating layer 30 be about 80-200 μm.

A material of the resin insulating layer 30 may be a resin composition that contains a core material such as glass fiber, and may also be simply a resin composition that does not contain a core material. As the resin composition, an epoxy resin is preferably used. Further, an epoxy resin containing 70-95% by weight of an inorganic filler such as silica may also be used. Further, the material of the resin insulating layer 30 may also be a resin composition suitable to be supplied in a sheet form or a film form when the printed wiring board 10 is manufactured, or may also be a resin material for molding suitable for a case where the resin insulating layer 30 is formed by molding. When a resin material for molding is selected, that the material of the resin insulating layer 30 has a thermal expansion coefficient of 6 ppm/° C. or more and 25 ppm/° C. or less and an elastic modulus of 5 GPa or more and 30 GPa or less is preferable in that a good flowability can be obtained in a mold during molding and an excessive stress does not occur after the molding at an interface with the wiring conductor layer 21 and at a portion connecting to a semiconductor element (not illustrated in the drawings) or the like that is mounted on the first surface (SF1) side of the resin insulating layer 30. However, a material having a thermal expansion coefficient and an elastic modulus outside the above-described ranges may also be used for the resin insulating layer 30.

As illustrated in FIG. 1A, the first surface (F1) of the wiring conductor layer 21 is positioned on the second surface (SF2) side more than the first surface (SF1) of the resin insulating layer 30 does, and is recessed relative to the first surface (SF1). A recess amount of the recess is, for example, 0.1-6 μm. In this way, the wiring conductor layer 21 is formed. Therefore, when a semiconductor element (not illustrated in the drawings) is connected to the second pattern (21b) or the like by a bonding material or the like, a portion of the resin insulating layer 30 between second patterns (21b) becomes a wall. Even when a semiconductor element on which electrodes are formed at a narrow pitch is connected, a state in which bonding materials or the like become in contact with each other and cause electrical short circuiting to occur between adjacent second patterns (21b) can be prevented. Further, the wiring conductor layer 21 is formed to have a thickness of about 10-25 μm. This allows the wiring conductor layer 21 to be formed in a relatively short period of time using an electrolytic plating method while ensuring a certain conductivity.

Further, the end surface (25a) of the conductor post 25 is positioned on the first surface (SF1) side more than the second surface (SF2) of the resin insulating layer 30 does, and is recessed relative to the second surface (SF2). A recess amount of the recess is, for example, 3-15 μm. By making the recess amount such a distance, when the conductor post 25 is connected to another printed wiring board (not illustrated in the drawings) or the like, a bonding material layer 27 (see FIG. 2B) such as solder can be formed on the end surface (25a) of the conductor post 25 without wetly spreading to the side surface (25b) of the conductor post 25 and the like. Further, when bonding materials are melted, a portion of the resin insulating layer 30 between conductor posts 25 becomes a wall and a state in which the bonding materials become in contact with each other and cause electrical short circuiting between adjacent conductor posts 25 can be prevented. A height of the conductor post 25 is not particularly limited as long as it is a height that allows the wiring conductor layer 21 and a motherboard or the like on the second surface (SF2) side of the resin insulating layer 30 to be connected. For example, the height is 50-150 μm. When the conductor post 25 is formed to have such a height, the conductor post 25 can be applied to a resin insulating layer having a thickness of about 100-200 μm, in which a large number of conductor posts 25 are used. However, these dimensions are not limited to these examples.

In this way, in the present embodiment, a distance from the second surface (SF2) of the resin insulating layer 30 to the end surface (25a) of the conductor post 25 is larger than a distance from the first surface (SF1) of the resin insulating layer 30 to the first surface (F1) of the wiring conductor layer 21. That is, the recess of the end surface (25a) of the conductor post 25 relative to the second surface (SF2) of the resin insulating layer 30 is deeper than the recess of the first surface (F1) of the wiring conductor layer 21 relative to the first surface (SF1) of the resin insulating layer 30.

A method for forming the wiring conductor layer 21 and the conductor post 25 is not particularly limited. However, it is preferable that the wiring conductor layer 21 and the conductor post 25 be formed using an electrolytic plating method that allows a metal film to be easily formed at a low cost. Further, other than the electrolytic plating method, for example, the wiring conductor layer 21 may also be formed using an ink jet method or the like. Further, for example, the conductor post 25 may also be formed by forming in advance a conductor pin made of a conductive material in a shape of a circular cylinder or a quadrangular prism and connecting the conductor pin to the first pattern (21a). Even when the conductor post 25 is formed by electrolytic plating, the conductor post 25 can be formed to have any planar shape.

The material that forms the wiring conductor layer 21 and the conductor post 25 is not particularly limited. However, copper that allows easy formation of the wiring conductor layer 21 and the conductor post 25 by electrolytic plating and has excellent conductivity is mainly used. However, the wiring conductor layer 21 and the conductor post 25 may also be formed of a material other than copper, such as a copper alloy or a conductive paste obtained in a paste form by mixing a conductive material and a resin composition.

Figure 2A:
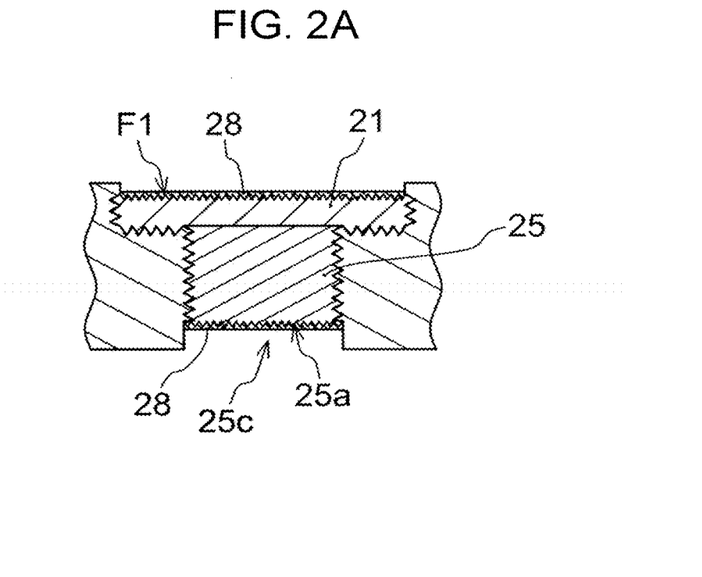
FIG. 2A is a cross-sectional view of a wiring conductor layer and a conductor post of FIG. 1A, on each of which a surface protection film is formed.

As illustrated in FIG. 2A, a surface protection film 28 may be formed on the first surface (F1) of the wiring conductor layer 21 and on the end surface (25a) of the conductor post 25. Here, in addition to the meaning of a film that protects the wiring conductor layer 21 and the conductor post 25 against corrosion such as oxidation, the "surface protection film" also includes the meaning of a film that is formed on the first surface (F1) and on the end surface (25a) in order to obtain a good bondability with a bonding material such as solder or a bonding wire or the like. Examples of the surface protection film 28 include plating metal films that are each formed from multiple layers or a single layer such as Ni/Au, Ni/Pd/Au or Sn, and an organic protective film (OSP). Further, the surface protection film 28 may be formed on both of the first surface (F1) of the wiring conductor layer 21 and the end surface (25a) of the conductor post 25 or may be formed on only one of the two. Further, surface protection films of different materials may be respectively formed on the first surface (F1) of the wiring conductor layer 21 and on the end surface (25a) of the conductor post 25. For example, a metal film such as Ni/Au or Ni/Pd/Au may be formed on the first surface (F1) and an OSP may be formed on the end surface (25a).

Figure 2B:
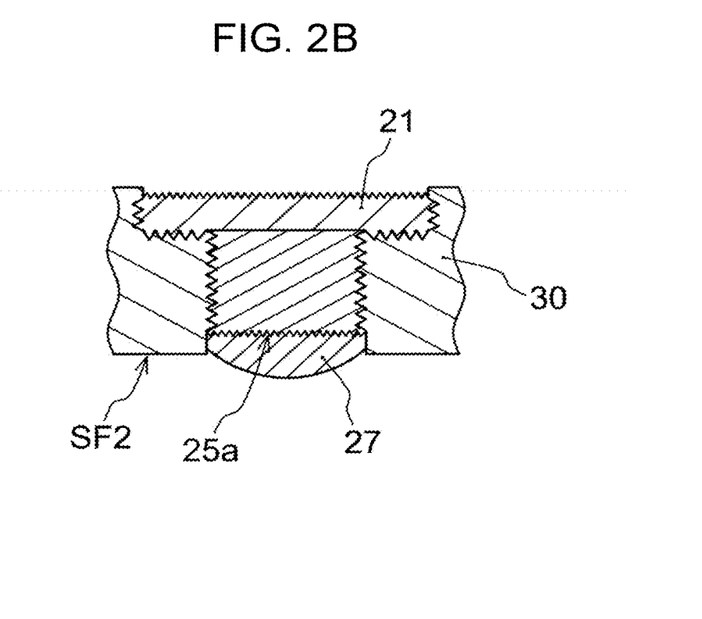
FIG. 2B is a cross-sectional view of a conductor post of FIG. 1A to an end surface of which solder is applied.

Further, as illustrated in FIG. 2B, the bonding material layer 27 may be formed in a space (25c) (see FIG. 2A) on the end surface (25a) of the conductor post 25 that is recessed relative to the second surface (SF2) of the resin insulating layer 30. A material of the bonding material layer 27 is not particularly limited as long as the material allows the conductor post 25 and a motherboard (not illustrated in the drawings) or the like, on which the printed wiring board 10 is mounted, to be connected to each other. However, as the material, solder is preferably used. When solder is used, the bonding material layer 27 can be formed by applying paste-like solder or using a plating method. However, a method for forming the bonding material layer 27 is not particularly limited, and any other method, such as a method in which solder balls are mounted and are reflowed, may be used.

In the example illustrated in FIG. 2B, the bonding material layer 27 is formed protruding from the second surface (SF2) of the resin insulating layer 30. The bonding material layer 27 may also be formed not to protrude from the second surface (SF2) of the resin insulating layer 30, unlike the example illustrated in FIG. 2B, or, may also be formed to protrude from the second surface (SF2) in an amount more than that in the example illustrated in FIG. 2B.

Figure 3A:
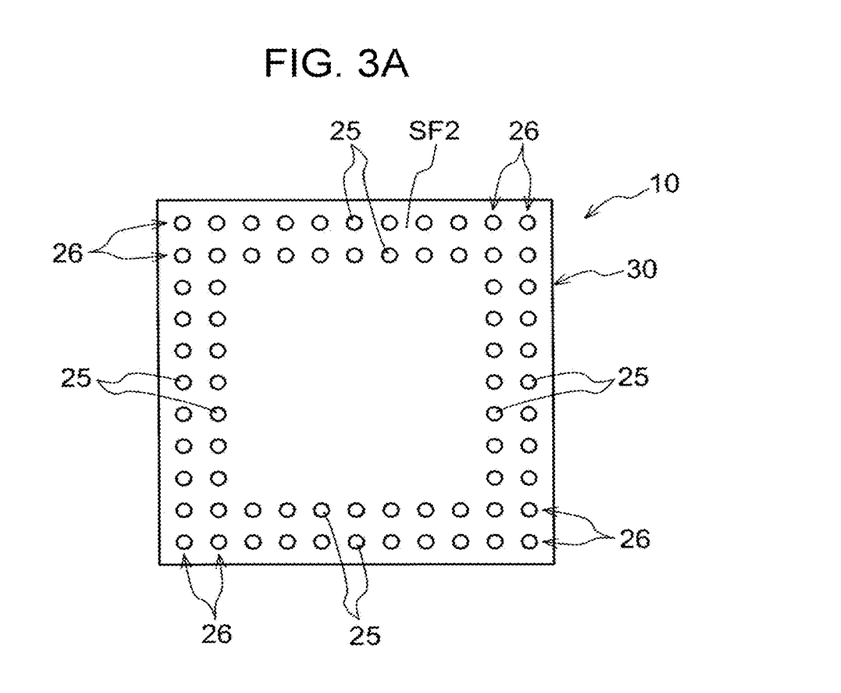
FIG. 3A illustrates an example of a layout of conductor posts of a printed wiring board according to an embodiment of the present invention.
Figure 3B:
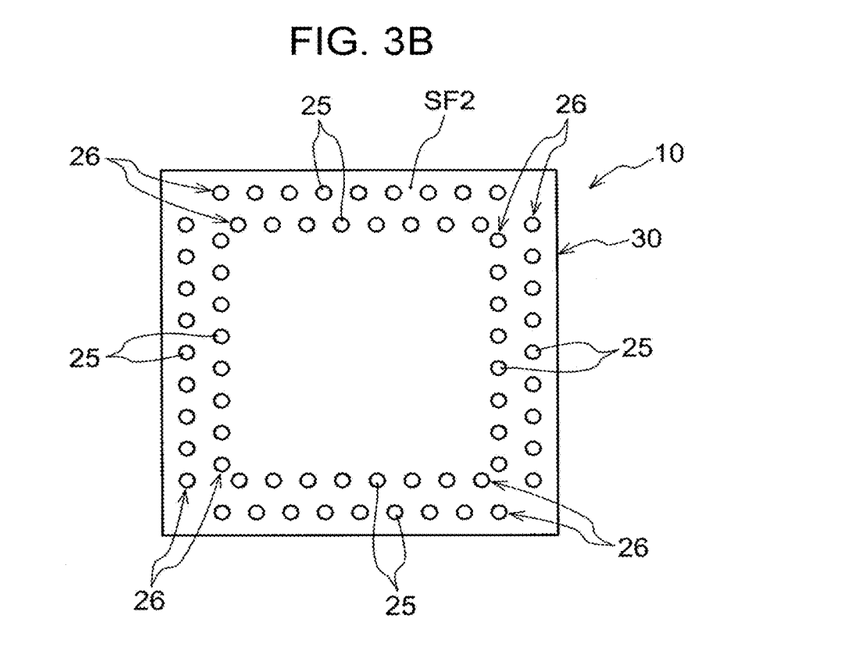
FIG. 3B illustrates another example of a layout of conductor posts of a printed wiring board according to an embodiment of the present invention.

FIGS. 3A and 3B illustrate examples of positioning of conductor posts 25 of the printed wiring board 10 of the present embodiment on the second surface (SF2) of the resin insulating layer 30. In the example illustrated in FIG. 1A, one conductor post 25 is formed on each of both sides of a region where the second pattern (21b) is formed. However, the number of the conductor posts 25 that are formed and the positions where the conductor posts 25 are formed are not limited to those illustrated in FIG. 1A. For example, as illustrated in FIG. 3A, it is also possible that two conductor post rows 26 are formed and are arrayed in parallel along each side of the printed wiring board 10, the conductor post rows 26 being each formed by arraying side by side multiple conductor posts 25 in one direction. It is also possible that three or more conductor post rows 26 are arrayed in parallel. For example, it is also possible that the conductor posts 25 are formed in a lattice pattern over the entire second surface (SF2) of the resin insulating layer 30. The first pattern (21a) is formed on the first surface (SF1) of the resin insulating layer 30 at positions corresponding to the positions at which the conductor posts 25 are formed on the second surface (SF2).

Further, as illustrated in FIG. 3B, it is also possible that the two conductor post rows 26 that are arrayed in parallel are formed such that the positions of the conductor posts 25 are shifted between the two rows in a row direction. In the example illustrated in FIG. 3B, the two conductor post rows 26, which are formed adjacent to each other and in each of which the conductor posts 25 are arrayed side by side at the same pitch, are formed such that the positions of the conductor posts 25 in one conductor post row 26 are shifted in the row direction by a length equal to one half of the array pitch with respect to the positions of the conductor posts 25 in the other conductor post row 26. That is, the conductor posts 25 are arrayed in a zigzag pattern. In this way, by arraying the conductor posts 25 in the zigzag pattern, an interval between conductor posts 25 of adjacent conductor post rows 26 becomes wider and a state in which electrical short circuiting occurs between the conductor posts 25 is less likely to occur. Therefore, the conductor post rows 26 can be formed in parallel at a narrower pitch. Also in the example illustrated in FIG. 3B, it is also possible that the conductor post rows 26 are formed over the entire second surface (SF2) of the resin insulating layer 30.

Next, an example of a method for manufacturing the printed wiring board 10 of the present embodiment is described with reference to FIG. 4A-4J.

Figure 4F:
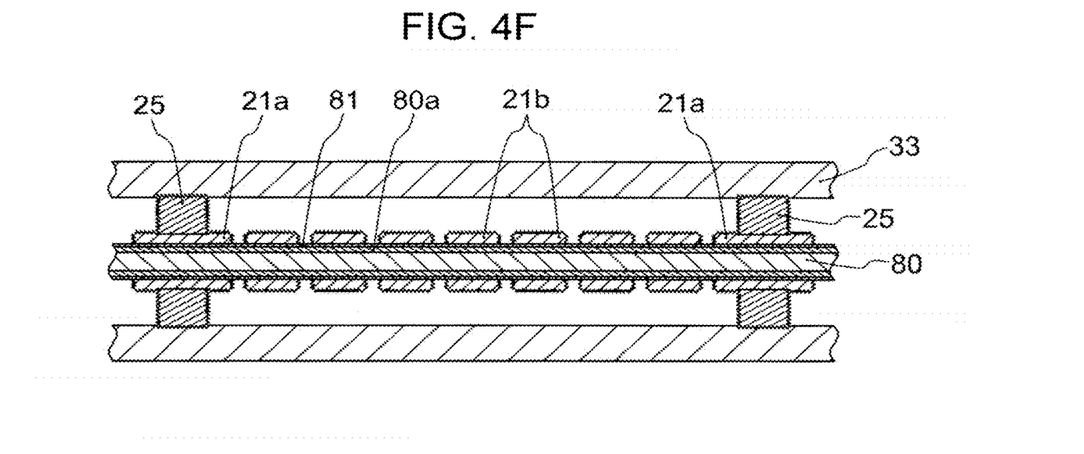
FIG. 4F is an explanatory diagram of a method for manufacturing the printed wiring board illustrated in FIG. 1A according to an embodiment of the present invention.
Figure 4G:
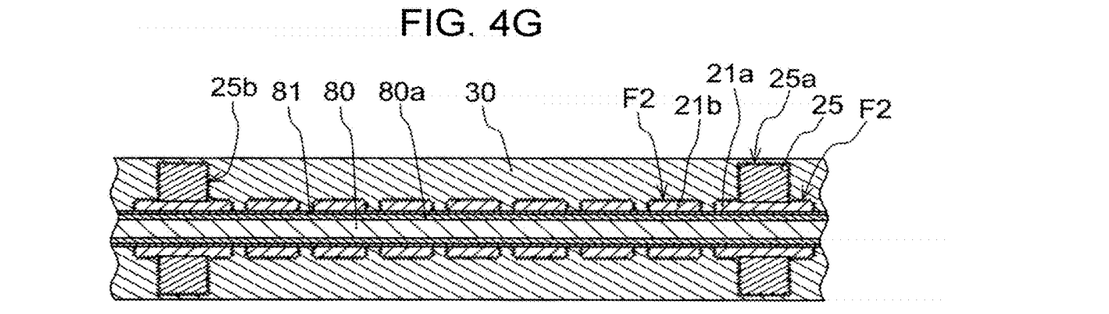
FIG. 4G is an explanatory diagram of a method for manufacturing the printed wiring board illustrated in FIG. 1A according to an embodiment of the present invention.
Figure 4H:
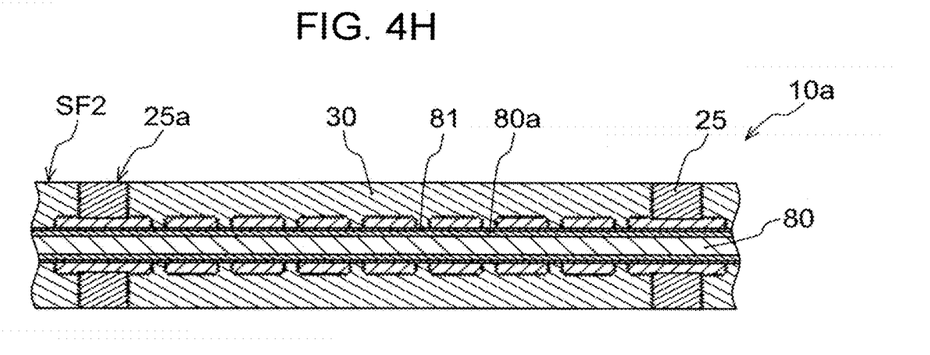
FIG. 4H is an explanatory diagram of a method for manufacturing the printed wiring board illustrated in FIG. 1A according to an embodiment of the present invention.
Figure 4I:
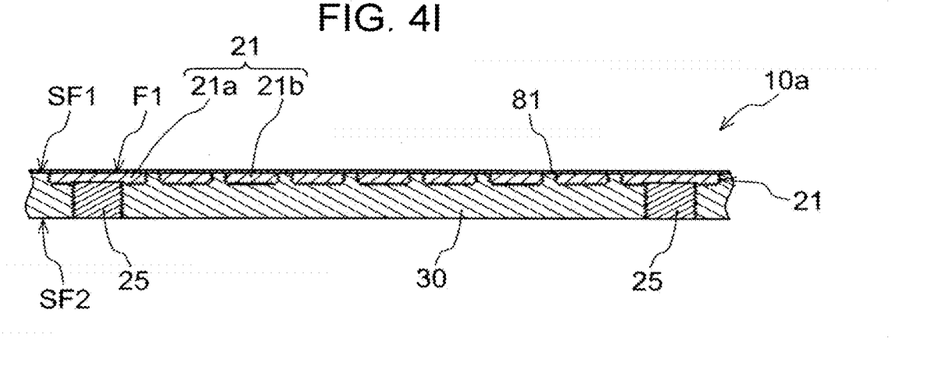
FIG. 4I is an explanatory diagram of a method for manufacturing the printed wiring board illustrated in FIG. 1A according to an embodiment of the present invention.
Figure 4J:
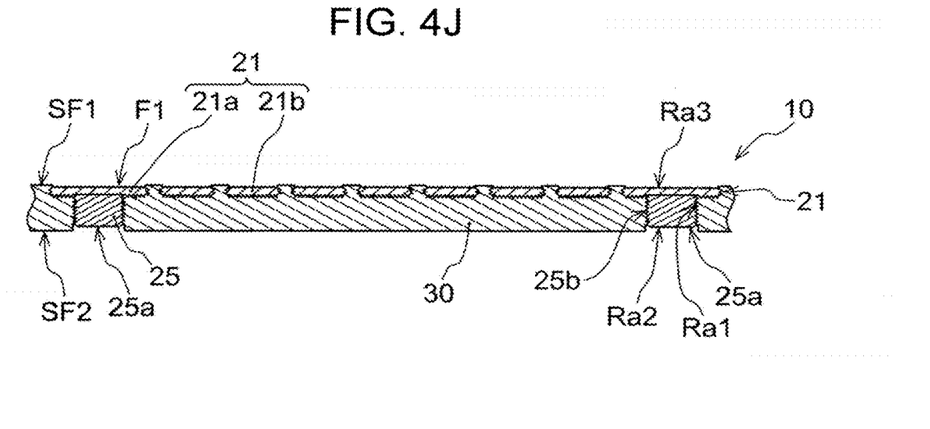
FIG. 4J is an explanatory diagram of a method for manufacturing the printed wiring board illustrated in FIG. 1A according to an embodiment of the present invention.

In the method for manufacturing the printed wiring board 10 of the embodiment, a base metal foil is prepared (FIG. 4A); a wiring conductor layer 21 having a predetermined pattern is formed on the base metal foil 81 (FIG. 4B); a conductor post 25 is formed on an exposed second surface (F2) of the wiring conductor layer 21 (FIG. 4D); and exposed surfaces of the wiring conductor layer 21 and the conductor post 25 are subjected to a roughening treatment so that a surface roughness of a side surface (25b) of the conductor post 25 is a first roughness (R1) (Ra1) (FIG. 4E). A resin insulating layer 30 is formed by using a mold resin to cover the exposed second surface (F2) and side surface of the wiring conductor layer 21 and the side surface (25b) of the conductor post 25 (FIG. 4G); an end surface (25a) of the conductor post 25 on an opposite side of the wiring conductor layer 21 is polished and thereby a surface roughness of the end surface (25a) is reduced to smaller than the first roughness (R1) (Ra1) (FIG. 4H). Thereafter, the base metal foil 81 is removed using an etching solution that can roughen a surface and the end surface (25a) of the conductor post 25 is also subjected to etching. Thereby, the surface roughness of the end surface (25a) becomes a second roughness (R2) (Ra2) (FIG. 4J). In this case, a first surface (F1) of the wiring conductor layer 21 also has a third roughness (Ra3). With reference to FIG. 4A-4J, the method for manufacturing the printed wiring board 10 is further described in detail using a specific example.

First, as illustrated in FIG. 4A, the base metal foil 81 is prepared by pasting the base metal foil 81 on a carrier copper foil (80a) that is provided on a surface of a support plate 80. The carrier copper foil (80a) is laminated on both sides of the support plate 80, and is bonded thereto by applying pressure and heat. For the support plate 80, a prepreg material or the like in a semi-cured state that is formed of a material obtained by impregnating a core material such as a glass cloth with an insulating resin such as epoxy is preferably used. However, without being limited to this, other materials may also be used. A material of the base metal foil 81 is a material that allows the wiring conductor layer 21 (to be described later) (see FIG. 4B) to be formed on a surface of the material. As the material of the base metal foil 81, a material is used that can be similarly dissolved in an etching solution in which the material of the wiring conductor layer 21 and the material of conductor post 25 (to be described later) (see FIG. 4D) are dissolved, and a copper foil having a thickness of 2-3 μm is preferably used. Further, as the carrier copper foil (80a), for example, a copper foil having a thickness of 15-30 μm, preferably 18 μm, is used. However, the carrier copper foil (80a) is not limited to have these thicknesses, but may also have other thicknesses.

A method for bonding the carrier copper foil (80a) and the base metal foil 81 is not particularly limited. However, for example, a thermoplastic adhesive film is used. Therefore, the base metal foil 81 can be easily peeled from the carrier copper foil (80a) later by applying heat. However, the bonding is not limited to this example. As long as a thermoplastic adhesive is used that allows the base metal foil 81 to be easily peeled from the carrier copper foil (80a) by increasing temperature, the base metal foil 81 and the carrier copper foil (80a) may be bonded to each other over substantially entire sticking surfaces of the two, or the two may be bonded using an adhesive or by ultrasonic connection in a margin portion in a vicinity of an outer periphery where a conductor pattern of the first conductor layer 21 (to be described later) (see FIG. 2B) is not provided. Further, the carrier copper foil (80a) and the base metal foil 81 may be bonded to each other before the carrier copper foil (80a) is bonded to the support plate 80. Or, for example, it is also possible that a double-sided copper-clad laminated plate is used for the support plate 80; a copper foil on a surface of the double-sided copper-clad laminated plate is used as the carrier copper foil (80a); and a single base metal foil 81 is bonded onto the carrier copper foil (80a) using the above-described method or the like.

In FIG. 4A-4H, an example of an manufacturing method is illustrated in which the base metal foil 81 is bonded to surfaces on both sides of the support plate 80 and the wiring conductor layer 21, the conductor post 25 and the resin insulating layer 30 are formed on each of the surfaces. Such a manufacturing method is preferable in that two printed wiring boards each including the wiring conductor layer 21, the conductor post 25 and the like are simultaneously formed. However, it is also possible that the wiring conductor layer 21 and the like are formed on only one side of the support plate 80. Further, it is also possible that wiring conductor layers having mutually different circuit patterns are respectively formed on the two sides of the support plate 80. The following description is given with reference to an example in which the same circuit patterns are formed on both sides of the support plate 80. Therefore, the description is given regarding only one side, and the description regarding the other side and reference numeral symbols for the other side in the drawings are omitted.

Next, as illustrated in FIG. 4B, the wiring conductor layer 21 is formed on the base metal foil 81. A method for forming the wiring conductor layer 21 is not particularly limited. However, for example, an electrolytic plating method is used. Specifically, first, a resist material (not illustrated in the drawings) is applied to or laminated on an entire surface of the base metal foil 81 and is patterned. Thereby, a plating resist film (not illustrated in the drawings) is formed in a predetermined region other than a portion where the wiring conductor layer 21 is formed. Next, a plating film is formed, for example, by electrolytic plating using the base metal foil 81 as a seed layer on a portion of the base metal foil 81 where the plating resist film is not formed. Thereafter, the plating resist film is removed. As a result, as illustrated in FIG. 4B, the wiring conductor layer 21, in which the first pattern (21*a*) and the second pattern (21*b*) are formed, is formed in a predetermined circuit pattern on the base metal foil 81. The wiring conductor layer 21 is preferably formed of the same material as that of the conductor post (to be described later), and is preferably formed of copper. Further, the wiring conductor layer 21 can be preferably formed to have a thickness of 10-30 μm. However, the present invention is not limited to this.

Next, the conductor post 25 is formed on the first pattern (21*a*) of the wiring conductor layer 21. Specifically, first, as illustrated in FIG. 4C, a plating resist film 85 is formed on a surface (second surface (F2)) of the wiring conductor layer 21 on a side opposite to a surface (first surface (F1)) that is in contact with the base metal foil 81, excluding a portion where the conductor post 25 (see FIG. 4D) is formed, and on the base metal foil 81 that is exposed without being covered by the wiring conductor layer 21. The plating resist film 85 is formed to have a thickness of at least about 50-150 μm. Next, a plating layer 250 is formed, for example, by electrolytic plating using the base metal foil 81 as a seed layer on the first pattern (21*a*) where the plating resist film 85 is not formed. Thereafter, the plating resist film 85 is removed. As a result, as illustrated in FIG. 4D, the conductor post 25 is formed from the plating layer on the second surface (F2) of the first pattern (21*a*), the plating layer being formed by electrolytic plating. The conductor post 25 is preferably formed of the same material as that of the wiring conductor layer 21, and is preferably formed of copper. Further, the conductor post 25 can be preferably formed to have a thickness of 50-150 μm. However, the present invention is not limited to this.

Next, as illustrated in FIG. 4E, in order to improve adhesion to the resin insulating layer 30 (to be described later), the side surface (25*b*) and the end surface (25*a*) of the conductor post 25, and the side surface of the wiring conductor layer 21 and the portion of the second surface (F2) where the conductor post 25 is not formed, are subjected to a roughening treatment. A method of the roughening treatment is not particularly limited. However, for example, as described above, a CZ treatment method or the like can be adopted. The surfaces to be roughened are preferably each processed to have a surface roughness of 0.4-1.5 μm in arithmetic average roughness. Further, when the roughening treatment is performed, between the removal of the plating resist film 85 and the roughening treatment, in order to stabilize the roughening, an annealing treatment that allows electrolytic plating copper crystals to grow may be performed. Other examples of the roughening treatment include a blackening (oxidation)-reduction treatment, sandblasting, and the like. Further, a soft etching method may also be adopted.

Next, the resin insulating layer 30 (see FIG. 4G) that covers the wiring conductor layer 21 and the conductor post 25 is formed. Specifically, first, as illustrated in FIG. 4F, a sheet-like or film-like insulating material 33 is laminated on the conductor post 25, and is pressed toward the support plate 80 side and is heated. Due to the heating, the insulating material 33 is softened, and flows into between the first pattern (21*a*) and the second pattern (21*b*), between second patterns (21*b*) and between conductor posts 25, and solidifies in a semi-cured state. Thereafter, the insulating material 33 is completely cured by being further heated and, as illustrated in FIG. 4G, the resin insulating layer 30 is formed that covers the side surface of the first pattern (21*a*) and the portion of the second surface (F2) of the first pattern (21*a*) where the conductor post 25 is not formed, the side surface and the second surface (F2) of the second pattern (21*b*), and the entire side surface and end surface (25*a*) of the conductor post 25. In this case, the insulating material 33 is completely softened and flows into gaps. Therefore, the insulating material 33 seeps also into recessed portions of jagged surfaces including the roughened side surface of the conductor post 25 and the roughened second surface of the wiring conductor layer 21, and is then cured. As a result, contact surfaces of the conductor post 25 or the wiring conductor layer 21 and the resin insulating layer 30 are in close contact with each other in a form in which the resin insulating layer 30 bites into recesses portions of the jagged surfaces that have been subjected to the roughening treatment. As a result, even when the thermal expansion coefficients of the two are different, peeling due to heat cycles no longer occurs. Such a method in which a sheet-like or film-like insulating material is laminated to form the resin insulating layer 30 is preferable in that the resin insulating layer 30 can be formed using common equipment for manufacturing a printed wiring board. After the resin insulating layer 30 is formed, preferably, buffing is performed and burrs that occur during the formation of the resin insulating layer 30 are removed.

Next, as illustrated in FIG. 4H, a surface (second surface (SF2)) of the resin insulating layer 30 on an opposite side of the base metal foil 81 side is polished by buffing, CMP (Chemical Mechanical Polishing) or the like until the front end of the conductor post 25 is exposed on the second surface (SF2). The end surface (25*a*) of the conductor post 25 can be roughened to have substantially the same roughness (first roughness (R1)) as the side surface (25*b*) in the above-described process illustrated in FIG. 4E. However, even after the end surface (25*a*) is exposed on the second surface (SF2), the buffing or the like is continued. Thereby, the roughness of the end surface (25*a*) can be reduced to smaller than the first roughness (R1). For example, the end surface (25a) is temporarily nearly flattened.

Next, the support plate 80 and the carrier copper foil (80a) are separated from the base metal foil 81. Specifically, first, for example, in a state in which a half-way product (10a) of printed wiring boards illustrated in FIG. 4H is heated and the thermoplastic adhesive film (not illustrated in the drawings) that bonds the carrier copper foil (80a) and the base metal foil 81 is softened, a force is applied to the support plate 80 and the carrier copper foil (80a) in a direction along an interface with the base metal foil 81, so that the carrier copper foil (80a) and the base metal foil 81 are pulled apart from each other. Or, as described above, when the carrier copper foil (80a) and the base metal foil 81 are bonded by an adhesive or by ultrasound connection in a margin portion in a vicinity of an outer periphery, it is also possible that the carrier copper foil (80a), the base metal foil 81 and the support plate 80 together with the resin insulating layer 30 and the like are cut on an inner peripheral side than the bonding area, and the bonding area due to the adhesive or the like is removed, and thereby, the carrier copper foil (80a) and the base metal foil 81 are separated from each other. As a result, the half-way product (10a) of the printed wiring boards becomes two separate half-way products. This state is illustrated in FIG. 4I. Only one half-way product (10a) of a printed wiring board illustrated on a lower side of the support plate 80 in FIG. 4H is illustrated in FIG. 4I.

Next, the base metal foil 81 is removed by etching. An etching solution that allows all of the materials of the base metal foil 81, the wiring conductor layer 21 and the conductor post 25 to be dissolved is used. In addition, the end part (25a) of the conductor post 25, without being covered, is immersed in the etching solution. As a result, together with the etching of the base metal foil 81, the end surface (25a) side of the conductor post 25 is also etched. Further, even after the base metal foil 81 is etched, etching is continued for a while so that the base metal foil 81 is completely removed. As a result, the first surface (F1) of the wiring conductor layer 21 is also etched. For the etching, for example, a hydrogen peroxide based etching solution is used. By the etching, as described above, the roughening treatment of the surface roughnesses (Ra2, Ra3) is performed. That is, the roughening treatment by the etching results in a reduced surface roughness after the etching as compared to the above-described roughening treatment by the CZ treatment.

As a result, as illustrated in FIG. 4J, the printed wiring board 10 is obtained in which the end surface (25a) of the conductor post 25 and the first surface (F1) of the wiring conductor layer 21 are formed as rough surface having the surface roughnesses (Ra2, Ra3), and the side surface (25b) of the conductor post 25 and the second surface (F2) of the wiring conductor layer 21 are formed as rough surface having the surface roughness (Ra1).

After the removal of the base metal foil 81, preferably, the above-described surface protection film 28 (see FIG. 2A) is formed on the first surface (F1) of the wiring conductor layer 21 and on the end surface (25a) of the conductor post 25. Further, an OSP may be formed by immersion in a liquid protective material, spraying a protective material, or the like. The surface protection film may be formed on both of the first surface (F1) of the wiring conductor layer 21 and the end surface (25a) of the conductor post 25 or may be formed on only one of the two. Further, surface protection films of different materials may be respectively formed on the first surface (F1) of the wiring conductor layer 21 and the end surface (25a) of the conductor post 25.

Further, in addition to the formation of the surface protection film, or without forming the surface protection film, a bonding material layer 27 (see FIG. 2B) formed of a bonding material that bonds the conductor post 25 and an external motherboard or the like may be formed on the end surface (25a) of the conductor post 25. Solder is preferably used as a material of the bonding material layer 27. The bonding material layer 27 can be formed by applying a paste-like solder or positing solder balls and melting the solder once and then hardening the solder, or using a plating method. However, the material and the formation method of the bonding material layer are not particularly limited. Other materials and methods can also be used.

By undergoing the above-described processes, the printed wiring board 10 of the embodiment illustrated in FIG. 1A is completed. A semiconductor element (not illustrated in the drawings) may be connected on the second pattern (21b) of the completed printed wiring board 10. Further, the end surface (25a) of the conductor post 25 may be connected to a motherboard or the like of an electronic device or the like in which the printed wiring board 10 is used, or may be connected to another printed wiring board (not illustrated in the drawings) and used as a part of a multilayer printed wiring board.

In the above description presented with reference to FIG. 4A-4J, an example of the method for manufacturing the printed wiring board 10 of the embodiment is described in which the sheet-like or film-like insulating material 33 is laminated and is heated and pressed and thereby the resin insulating layer 30 is formed. However, the resin insulating layer 30 of the printed wiring board 10 of the embodiment can also be formed, for example, by cast molding (flow-in molding) and the like. This method is described below with reference to FIG. 5A-5D. In FIG. 5A-5D, for simplicity, an example is illustrated in which the wiring conductor layer 21 and the like are formed only on the upper side of support plate 80. In the this manufacturing method, processes other than the process for forming the resin insulating layer 30 are the same as in the manufacturing method described with reference to FIG. 4A-4J. Therefore, drawings corresponding to FIGS. 4A-4D, 4I and 4J and description about the processes of these drawings are omitted as appropriate.

Figure 5A:
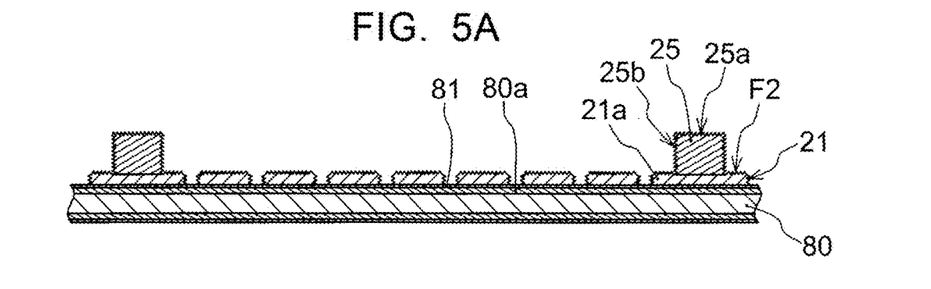
FIG. 5A is an explanatory diagram of another method for manufacturing the printed wiring board illustrated in FIG. 1A according to an embodiment of the present invention.

In this manufacturing method, through the same processes as those described with reference to FIG. 4A-4D, as illustrated in FIG. 5A (corresponding to FIG. 4E), a state is achieved in which the side surface (25b) and the end surface (25a) of the conductor post 25, the side surface of the wiring conductor layer 21, and the portion of the second surface (F2) of the wiring conductor layer 21 where the conductor post 25 is not formed, have been subjected to a roughening treatment. The roughening treatment is the same as the above-described process of FIG. 4E.

Figure 5B:
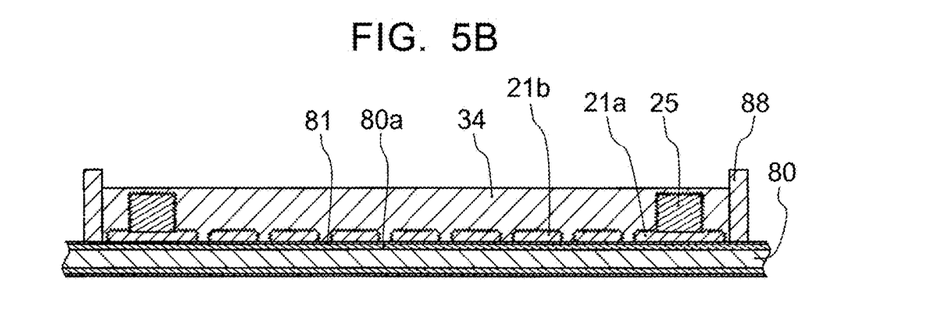
FIG. 5B is an explanatory diagram of the other method for manufacturing the printed wiring board illustrated in FIG. 1A according to an embodiment of the present invention.

Next, as illustrated in FIG. 5B, a dam 88 is formed in a surrounding area. The dam 88 dams injected liquid mold resin 34. In FIG. 5B, the dam 88 is formed around one printed wiring board. However, in practice, in a case where multiple printed wiring boards are collectively manufactured in a form of a panel or the like, the dam 88 is formed around all of the multiple printed wiring boards of the panel or the like that are manufactured at the same time. The mold resin 34 is poured in to an extent that the end surface (25a) of the conductor post 25 is hidden.

Figure 5C:
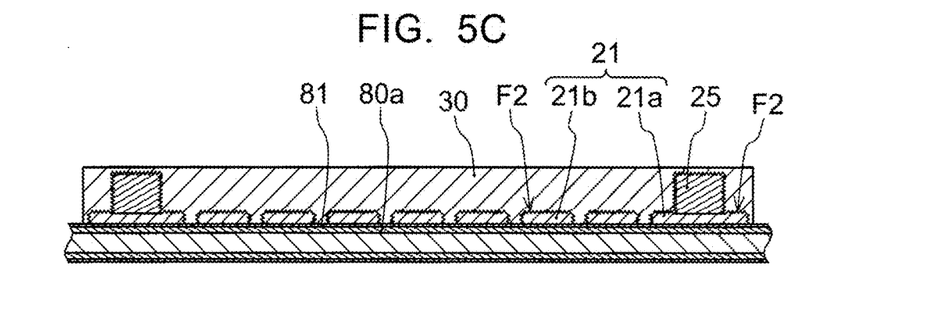
FIG. 5C is an explanatory diagram of the other method for manufacturing the printed wiring board illustrated in FIG. 1A according to an embodiment of the present invention.
Figure 5D:
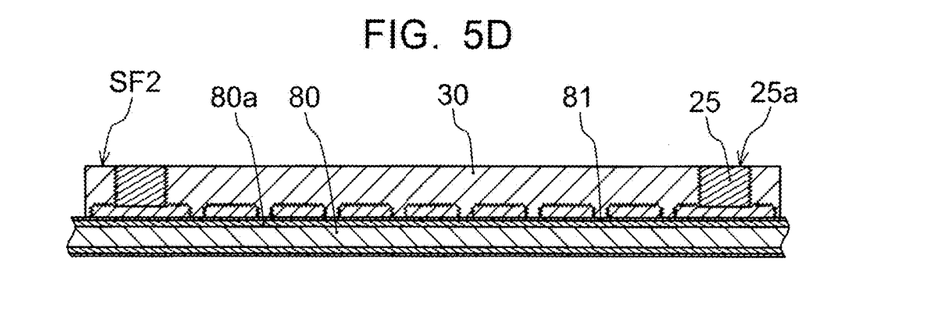
FIG. 5D is an explanatory diagram of the other method for manufacturing the printed wiring board illustrated in FIG. 1A according to an embodiment of the present invention.

Next, temperature is raised to cure the mold resin 34. Thereby, the resin insulating layer 30 is formed. Thereafter, the dam is removed. This state is illustrated in FIG. 5C. Thereafter, as illustrated in FIG. 5D, the surface (second surface (SF2)) of the resin insulating layer 30 on an opposite side of the base metal foil 81 is polished. That is, polishing by buffing, CMP or the like is performed until the front end (25a) of the conductor post 25 is exposed on the second surface (SF2). A state after the polishing corresponds to that of the above-described process of FIG. 4H.

Thereafter, through the same processes as those described with reference to FIGS. 4I and 4J, the printed wiring board 10 illustrated in FIG. 1A is completed. In this manufacturing method, the resin insulating layer 30 is formed using simple cast molding by only forming the dam. However, it is also possible that a surrounding area is covered by a mold and the resin insulating layer 30 is formed by injection molding. In the method for forming the resin insulating layer 30 using a mold resin, a material that is the same as a packaging material of a common electronic component that is packaged using a mold resin can be used. Therefore, such a method for forming the resin insulating layer 30 is preferable in that a stress due to a difference in thermal expansion coefficient is unlikely to occur at a bonding place or the like between the printed wiring board 10 and an electronic component that is mounted on the printed wiring board 10.

Further, the method for manufacturing the printed wiring board 10 of the present embodiment is not limited to the methods described with reference to FIG. 4A-4J and FIG. 5A-5D. The conditions, the processing order and the like of the methods may be arbitrarily modified. Further, certain processes may be omitted and other processes may be added.

When side surfaces and the like of a first conductor layer and a second conductive layer are covered by a mold resin, peeling at bonding interfaces between the mold resin and the first conductor layer and the second conductive layer is likely to occur. This is believed to be due to that a difference in thermal expansion coefficient between the mold resin and an electrolytic plating film such as the first conductor layer is large and thus the mold resin is peeled off from the first conductor layer or the like by repeated on-off heat cycles.

A printed wiring board according to an embodiment of the present invention includes: a wiring conductor layer that has a first surface and a second surface that is on an opposite side of the first surface; a conductor post that is formed on the second surface of the wiring conductor layer; and a resin insulating layer that has a first surface and a second surface that is on an opposite side of the first surface, embeds the wiring conductor layer such that the first surface of the wiring conductor layer is exposed on the first surface side of the resin insulating layer, and covers a side surface of the conductor post and exposes an end surface of the conductor post on the second surface side of the resin insulating layer. The side surface of the conductor post and the end surface of the conductor post are each subjected to a roughening treatment. When a surface roughness of the side surface is a first roughness (R1), and a surface roughness of the end surface is a second roughness (R2), R1>R2.

Further, a method for manufacturing a printed wiring board according to another embodiment of the present invention includes: preparing a base metal foil; forming a wiring conductor layer that has a predetermined pattern on the base metal foil; forming a conductor post on the wiring conductor layer; subjecting at least a side surface of the conductor post to a roughening treatment such that a surface roughness of the side surface of the conductor post is a first roughness (R1); forming a resin insulating layer by using a resin to cover at least the side surface of the conductor post and an end surface of the conductor post on an opposite side of the wiring conductor layer; exposing the end surface of the conductor post by polishing the resin insulating layer, and reducing a surface roughness of the end surface of the conductor post to smaller than the first roughness (R1); and making the surface roughness of the end surface of the conductor post to be a second roughness (R2) by removing the base metal foil using an etching solution that can roughen a surface and also subjecting the end surface to etching.

According to an embodiment of the present invention, the side surface of the conductor post is subjected to the roughening treatment. Therefore, the side surface of the conductor post becomes a jagged uneven surface. The unevenness due to the roughening treatment allows the side surface and the resin insulating layer to bite into each other, thereby achieving an anchor effect and improving adhesion. Further, the end surface of the conductor post, to which a motherboard or the like can be soldered, is also subjected to a roughening treatment so as to have a roughness smaller than that of the side surface. Since it allows solder or the like to easily wet spread into deep portions of the uneven surface, a low contact resistance and strong connection can be obtained.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a resin insulating layer;
a wiring conductor layer embedded in the resin insulating layer such that the wiring conductor layer has a first surface exposed from the resin insulating layer; and
a conductor post formed in the resin insulating layer and on a second surface of the wiring conductor layer on an opposite side with respect to the first surface of the wiring conductor layer such that the conductor post has a side surface covered by the resin insulating layer and an end surface exposed from the resin insulating layer on an opposite side with respect to the wiring conductor layer,
wherein the conductor post is formed such that the side surface of the conductor post is a roughened side surface having a surface roughness of a first roughness R1, the end surface of the conductor post is a roughened end surface having a surface roughness of a second roughness R2, and the first roughness R1 and the second roughness R2 satisfy R1>R2.

2. A printed wiring board according to claim 1, wherein the side surface of the conductor post is formed such that the first roughness R1 is an arithmetic average roughness Ra1 in a range of from 0.4 µm to 1.5 µm.

3. A printed wiring board according to claim 1, wherein the end surface of the conductor post is formed such that the second roughness R2 is an arithmetic average roughness Ra2 in a range of from 0.1 µm to 0.6 µm.

4. A printed wiring board according to claim 1, wherein the conductor post is formed such that the conductor post has one of a circular form, an elliptical form, a square form, a rectangular form and a diamond form on a planar surface.

5. A printed wiring board according to claim 1, wherein the resin insulating layer comprises a mold resin material which has a thermal expansion coefficient in a range of 6 ppm/° C. to 25 ppm/° C. and an elastic modulus in a range of 5 GPa to 30 GPa or less.

6. A printed wiring board according to claim 5, wherein the mold resin material comprises an epoxy resin and an inorganic filler in an amount of 70% by weight to 95% by weight in the epoxy resin.

7. A printed wiring board according to claim 1, wherein the end surface of the conductor post is recessed relative to a surface of the resin insulating layer in a recess amount of 3 μm to 15 μm, and the first surface of the wiring conductor layer is recessed relative to a surface of the resin insulating layer in a recess amount of 0.1 μm to 6 μm.

8. A printed wiring board according to claim 1, wherein the wiring conductor layer has a roughed surface including a side surface and a portion of the second surface exposed from the conductor post such that the roughened surface of the wiring conductor layer has a surface roughness which is equal to the surface roughness of the first roughness R1.

9. A printed wiring board according to claim 1, further comprising:
a surface protection film formed on the end surface of the conductor post.

10. A printed wiring board according to claim 9, further comprising:
a surface protection film formed on the first surface of the wiring conductor layer such that the surface protection film on the wiring conductor layer comprises a material which is different from a material of the surface protection film on the conductor post.

11. A printed wiring board according to claim 9, further comprising:
a solder layer coated on the end surface of the conductor post.

12. A printed wiring board according to claim 2, wherein the end surface of the conductor post is formed such that the second roughness R2 is an arithmetic average roughness Ra2 in a range of 0.1 μm to 0.6 μm.

13. A printed wiring board according to claim 12, wherein the end surface of the conductor post is recessed relative to a surface of the resin insulating layer in a recess amount of 3 μm to 15 μm, and the first surface of the wiring conductor layer is recessed relative to a surface of the resin insulating layer in a recess amount of 0.1 μm to 6 μm.

14. A method for manufacturing a printed wiring board, comprising:
forming a wiring conductor layer on a base metal foil such that the wiring conductor layer has a pattern;
forming a conductor post on the wiring conductor layer;
applying a roughening treatment to at least a side surface of the conductor post such that the side surface of the conductor post has a surface roughness of a first roughness R1;
forming a resin insulating layer such that the resin insulating layer covers at least the side surface of the conductor post and an end surface of the conductor post on an opposite side with respect to the wiring conductor layer;
polishing the resin insulating layer such that the end surface of the conductor post is exposed from the resin insulating layer and has a surface roughness which is smaller than the surface roughness of the first roughness R1; and
applying an etching solution to the wiring conductor layer and the conductor post such that the base metal foil is removed from the wiring conductor layer to expose a first surface of the wiring conductor layer and that the end surface of the conductor post has a surface roughness of a second roughness R2 which satisfies R1>R2.

15. A method for manufacturing a printed wiring board according to claim 14, wherein the roughening treatment comprises one of a CZ treatment, a blacking treatment and a sandblasting.

16. A method for manufacturing a printed wiring board according to claim 14, wherein the etching solution is a hydrogen peroxide based etching solution.

17. A method for manufacturing a printed wiring board according to claim 14, wherein the forming of the wiring conductor layer comprises applying electrolytic plating such that the wiring conductor layer comprising electrolytic plating material is formed, and the forming of the conductor post comprises applying electrolytic plating such that the conductor post comprising electrolytic plating material is formed.

18. A method for manufacturing a printed wiring board according to claim 14, wherein the forming of the resin insulating layer comprises positioning a film comprising a mold resin material on the end surface of the conductor post and heat-pressing the film such that the resin insulating layer is formed to cover at least the side surface of the conductor post and the end surface of the conductor post on the opposite side with respect to the wiring conductor layer.

19. A method for manufacturing a printed wiring board according to claim 14, wherein the forming of the resin insulating layer comprises forming a dam enclosing a panel having a plurality of printed wiring boards each comprising the wiring conductor layer and the conductor post, pouring a mold resin material onto the panel, and curing the mold resin material such that the resin insulating layer is formed to cover at least the side surface of the conductor post and the end surface of the conductor post on the opposite side with respect to the wiring conductor layer.

20. A method for manufacturing a printed wiring board according to claim 14, wherein the polishing of the resin insulating layer comprises at least one of buff polishing and CMP polishing.

* * * * *